United States Patent
Daido et al.

(10) Patent No.: US 10,354,631 B2
(45) Date of Patent: Jul. 16, 2019

(54) SOUND SIGNAL PROCESSING METHOD AND SOUND SIGNAL PROCESSING APPARATUS

(71) Applicant: YAMAHA CORPORATION, Hamamatsu-shi (JP)

(72) Inventors: Ryunosuke Daido, Hamamatsu (JP); Hiraku Kayama, Hamamatsu (JP); Sumiya Ishikawa, Tokyo (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 15/928,558

(22) Filed: Mar. 22, 2018

(65) Prior Publication Data
US 2018/0211644 A1 Jul. 26, 2018

Related U.S. Application Data

(63) Continuation of application No. PCT/JP2016/070731, filed on Jul. 13, 2016.

(30) Foreign Application Priority Data

Sep. 29, 2015 (JP) .................................. 2015-191555

(51) Int. Cl.
*G10H 1/36* (2006.01)
*G10L 21/00* (2013.01)
(Continued)

(52) U.S. Cl.
CPC ........... *G10H 1/366* (2013.01); *G10H 1/0008* (2013.01); *G10H 1/125* (2013.01); *G10L 21/003* (2013.01);
(Continued)

(58) Field of Classification Search
CPC ................................ G10H 1/366; G10L 21/00
(Continued)

(56) References Cited

U.S. PATENT DOCUMENTS 5,719,346 A 2/1998 Yoshida et al.
5,753,845 A * 5/1998 Nagata ................. G10H 1/0091
434/307 A (Continued)

FOREIGN PATENT DOCUMENTS

JP H08211871 A 8/1996
JP 2006011190 A 1/2006
(Continued)

OTHER PUBLICATIONS

TC-Helicon VOICELIVE Play GTX (downloaded on Sep. 28, 2018) The document is undated, a YouTube post clearly Apr. 12, 2012.*

(Continued)

*Primary Examiner* — David S Warren
(74) *Attorney, Agent, or Firm* — Rossi, Kimms & McDowell LLP

(57) ABSTRACT

A method for processing an input sound signal of singing voice, to obtain a sound signal with an impression different from the input sound signal, includes: selecting a genre from among a plurality of tune genres in accordance with a selection operation by a user, setting, to a first unit, a set of first parameters corresponding to the selected genre, displaying a first impression identifier corresponding to the selected genre for a first control of a first user parameter in the set of first parameters, changing the first user parameter in accordance with a change operation on the first control by the user, and strengthening, by the first unit, signal compo-
(Continued)

US 10,354,631 B2

Page 2 nents within a particular frequency band of the sound signal, in accordance with the set of first parameters including the first user parameters.

12 Claims, 4 Drawing Sheets

(51) Int. Cl.
*H04R 3/00* (2006.01)
*G10L 21/007* (2013.01)
*G10H 1/00* (2006.01)
*G10L 21/003* (2013.01)
*G10H 1/12* (2006.01)
*H03G 9/02* (2006.01)
*H03G 9/00* (2006.01)

(52) U.S. Cl.
CPC ........... *G10L 21/007* (2013.01); *H03G 9/025* (2013.01); *H04R 3/00* (2013.01); *G10H 2210/005* (2013.01); *G10H 2210/036* (2013.01); *G10H 2210/066* (2013.01); *G10H 2240/081* (2013.01); *H03G 9/00* (2013.01); *H04R 2410/00* (2013.01)

(58) Field of Classification Search
USPC .................................................... 84/626, 610
See application file for complete search history.

(56) References Cited

U.S. PATENT DOCUMENTS

| 9,424,859 | B2* | 8/2016 | Campbell | G10H 1/0091 |
| 10,062,367 | B1* | 8/2018 | Evans | G10H 1/366 |
| 2009/0018843 | A1 | 1/2009 | Kawashima | |
| 2014/0142927 | A1* | 5/2014 | Campbell | G10H 1/0091 |
| | | | | 704/201 |
| 2014/0142928 | A1* | 5/2014 | Campbell | G10H 1/0091 |
| | | | | 704/201 |
| 2015/0040743 | A1* | 2/2015 | Tachibana | G10H 1/361 |
| | | | | 84/622 |
| 2017/0025115 | A1* | 1/2017 | Tachibana | G10L 13/0335 |
| 2017/0301329 | A1* | 10/2017 | Yang | G10H 1/366 |
| 2017/0372724 | A1* | 12/2017 | Tootill | G10L 25/18 |
| 2018/0018957 | A1* | 1/2018 | Hamano | G10L 13/027 |
| 2018/0166064 | A1* | 6/2018 | Saino | G10L 13/00 |

FOREIGN PATENT DOCUMENTS

| JP | 2008040431 A | 2/2008 |
| JP | 2009020291 A | 1/2009 |
| JP | 2010014913 A | 1/2010 |
| JP | 2010060947 A | 3/2010 |
| JP | 2011095397 A | 5/2011 |
| JP | 2011197235 A | 10/2011 |

OTHER PUBLICATIONS

English translation of Written Opinion issued in Intl. Appln. No. PCT/JP2016/070731 dated Sep. 20, 2016, previously cited in IDS filed Mar. 22, 2018.
International Preliminary Report on Patentability issued in Intl. Appln. No. PCT/JP2016/070731 dated Apr. 12, 2018. English translation provided.
International Search Report issued in Intl. Appln. No. PCT/JP2016/070731 dated Sep. 20, 2016. English translation provided.
Written Opinion issued in Intl. Appln. No. PCT/JP2016/070731 dated Sep. 20, 2016.
Dolby. "An Audio Noise Reduction System." Journal of the Audio Engineering Society. Oct. 1967: 383-388. vol. 15, No. 4.

* cited by examiner

SOUND SIGNAL PROCESSING METHOD AND SOUND SIGNAL PROCESSING APPARATUS

CROSS-REFERENCE TO RELATED APPLICATION

The present application is continuation of International Application No. PCT/JP2016/70731 filed on Jul. 13, 2016, which claims priority from Japanese Application No. JP2015-191555 filed on Sep. 29, 2015. The contents of these applications are hereby incorporated by reference into this application.

BACKGROUND OF THE INVENTION

1. Field of the Invention

The present invention relates to a sound signal processing method and a sound signal processing apparatus.

2. Description of the Related Art

Specific examples of a signal processing element, which performs signal processing on a sound signal, include filters, compressors, and multiband compressors. A filter is a linear system through which signal components within a particular frequency band are attenuated or amplified in a multiplying manner, and is also called an equalizer. A compressor is a non-linear system with which the signal level of an input signal is measured successively to output the input signal with the level compressed when the measured level is high. A compressor is also utilized for its level compression effect and transient characteristics to control temporal changes of the level. The waveform of a sound signal on which level compression is performed by a compressor is known to be deformed (that is, high frequency components are added), and because of that fact, a compressor is sometimes used to add harmonic components. A multiband compressor is a non-linear system in which an input signal is divided into bands through a plurality of filters so that compressors each work on one of the bands, and output signals from the compressors are added up to be output as one signal. A multiband compressor is not only usable as a kind of compressor, but is also useful for adding signal components within a particular frequency band. In a possible use for a filter, a compressor, a multiband compressor, or a similar signal processing element, appropriate signal processing performed by the signal processing element on a sound signal that represents a singing voice in karaoke or the like can manipulate the impression of the singing voice to make the singing voice sound like that of a professional singer by, for example, changing the singing voice into a more robust singing voice or a warmer singing voice. There are, however, many parameters that define signal processing in those signal processing elements, and it is difficult for a karaoke user who possesses no special knowledge on signal processing to grasp all of the parameters. In addition, the parameters and impressions of a voice have complicate association relations, and general karaoke users do not know which parameter is to be set to what value in order to yield a desired impression.

Signal processing in a second-order peaking filter, which is given as a specific example of a filter, is defined by three parameters, namely, a center frequency, a gain, and an amplitude enhancement factor. General karaoke users do not know what values are to be set as the three parameters in order to close the gap between the impression of a singing voice and an impression aimed for. Even when a relation between a parameter and an impression is known, inconvenience occurs in that frequency components to be amplified by the filter are amplified excessively in the case where the content of the frequency components in a sound signal that is a processing target is high from the beginning. Signal processing in a compressor is defined by three parameters, namely, a threshold, a compression ratio (an amplification ratio of an input signal having a signal level exceeding the threshold), and a time constant. General karaoke users, however, do not know what values are to be set as the three parameters in order to close the gap between the impression of a singing voice and an impression aimed for. The problem becomes more compounded in the case of a multiband compressor, in which parameters related to filters and parameters related to compressors are required to be set. (RAY M. Dolby, "An Audio Noise Reduction System", JOURNAL OF THE AUDIO ENGINEERING SOCIETY, OCTOBER 1967, VOL. 15, NO. 4, p. 383-388) (Non-patent Literature 1)

SUMMARY OF THE INVENTION

A method for processing an input sound signal of singing voice, to obtain a sound signal with an impression different from the input sound signal, according to an aspect of the present invention includes: selecting a genre from among a plurality of tune genres in accordance with a selection operation by a user; setting, to a first unit, a set of first parameters corresponding to the selected genre; displaying a first impression identifier corresponding to the selected genre for a first control of a first user parameter in the set of first parameters; changing the first user parameter in accordance with a change operation on the first control by the user; and strengthening, by the first unit, signal components within a particular frequency band of the sound signal, in accordance with the set of first parameters including the first user parameters.

DETAILED DESCRIPTION OF THE INVENTION

Embodiments of the present invention are described below referring to the accompanying drawings.

Figure 1:
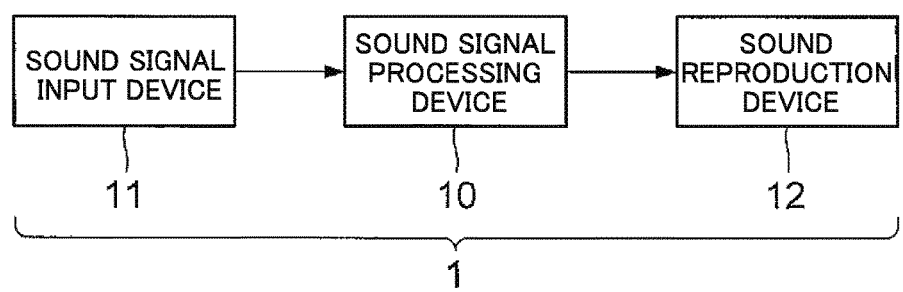
FIG. 1 is a diagram for illustrating an example of the configuration of a sound reproduction system 1, which includes a sound signal processing apparatus 10 according to an embodiment of the present invention.

FIG. 1 is a diagram for illustrating an example of the configuration of a sound reproduction system 1, which includes a sound signal processing apparatus 10 according to the embodiment of the present invention. The sound reproduction system 1 is, for example, a karaoke system, and includes a sound signal input apparatus 11 and a sound reproduction apparatus 12 besides the sound signal processing apparatus 10. The sound signal input apparatus 11 and the sound reproduction apparatus 12 are connected to the sound signal processing apparatus 10 via audio cables or other signal lines. The sound signal input apparatus 11 is a microphone used by a user of the sound reproduction system 1. When the user switches the sound signal input apparatus 11 on and starts singing a karaoke tune, the sound signal input apparatus 11 picks up the user's singing voice, and outputs a sound signal representing the singing voice to the sound signal processing apparatus 10. The sound reproduction apparatus 12 is, for example, a speaker. The sound reproduction apparatus 12 emits a sound corresponding to the sound signal supplied from the sound signal processing apparatus 10.

The sound signal processing apparatus 10 is what is called an online karaoke machine. The sound signal processing apparatus 10 prompts the user to select a karaoke tune to be sung, obtains a sound signal that represents the sound waveform of an accompaniment sound (hereinafter referred to as "accompaniment sound signal") of the karaoke tune from a karaoke tune distribution server (not shown in FIG. 1), and outputs the accompaniment sound signal to the sound reproduction apparatus 12. When a sound signal is started being input from the sound signal input apparatus 11, the sound signal processing apparatus 10 performs signal processing on the input sound signal, mixes the processed sound signal with the accompaniment sound signal, and outputs the mixed signal to the sound reproduction apparatus 12. The signal processing executed in the sound signal processing apparatus 10 according to this embodiment includes processing of changing the impression of a singing voice. The user of the sound reproduction system 1 can manipulate the impression of his or her own singing voice by operating the sound signal processing apparatus 10. The following description is centered on the sound signal processing apparatus 10, which prominently exhibits features of this embodiment.

Figure 2:
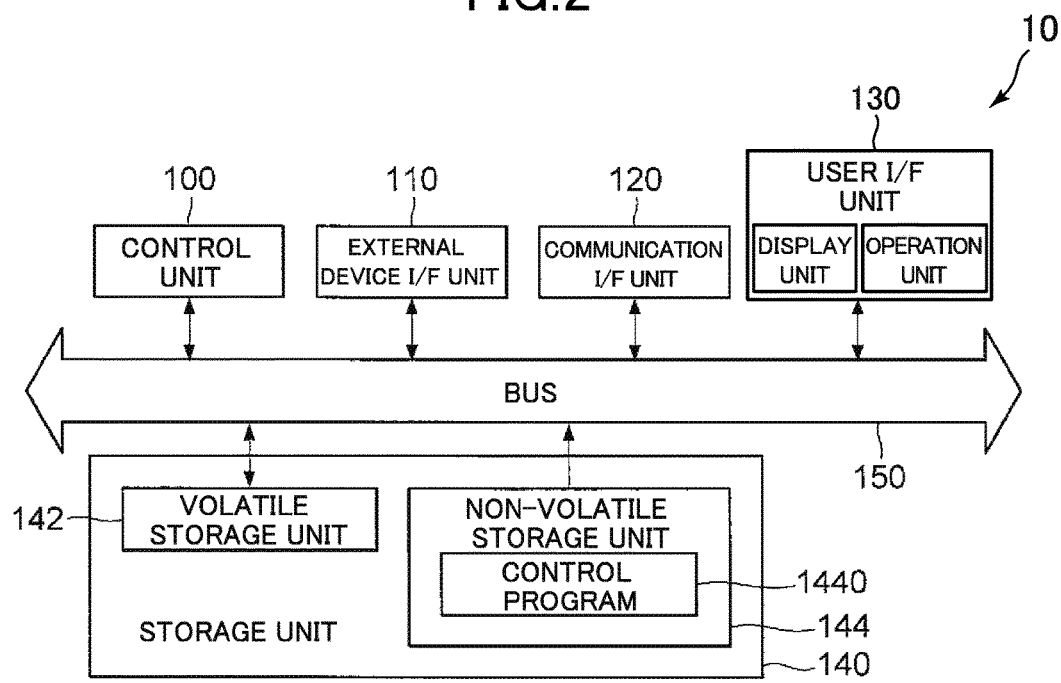
FIG. 2 is a diagram for illustrating an example of the configuration of the sound signal processing apparatus 10.

FIG. 2 is a diagram for illustrating an example of the configuration of the sound signal processing apparatus 10.

As illustrated in FIG. 2, the sound signal processing apparatus 10 includes a control unit 100, an external apparatus I/F unit 110, a communication I/F unit 120, a user I/F unit 130, a storage unit 140, and a bus 150 through which data is exchanged among the components of the sound signal processing apparatus 10.

The control unit 100 is, for example, a central processing unit (CPU). The control unit 100 functions as the center of control of the sound signal processing apparatus 10 by operating as programmed by a control program 1440, which is stored in the storage unit 140. Details of processing executed as programmed by the control program 1440 are disclosed later.

The external apparatus I/F unit 110 is an aggregation of I/Fs for connecting external apparatus via signal lines, for example, serial I/Fs or parallel I/Fs. In this embodiment, the sound signal input apparatus 11 and the sound reproduction apparatus 12 are each connected via a signal line to the external apparatus I/F unit 110. The external apparatus I/F unit 110 passes a signal received from a connected apparatus that is connected to the external apparatus I/F unit 110 to the control unit 100, and transmits a signal received from the control unit 100 to the connected apparatus. An analog apparatus to/from which an analog signal is input/output can be connected to the external apparatus I/F unit 110 when the external apparatus I/F unit 110 includes an A/D converter and a D/A converter. In this case, the external apparatus I/F unit 110 performs A/D conversion with the use of the A/D converter on an analog signal received from the connected apparatus to pass digital data that is the result of the A/D conversion to the control unit 100, and performs D/A conversion with the use of the D/A converter on digital data received from the control unit 100 to output an analog signal that is the result of the D/A conversion to the connected apparatus.

The communication I/F unit 120 is, for example, a network interface card (NIC). The communication I/F unit 120 is connected to a telecommunication line to receive data transmitted from an other apparatus such as a contents server via the telecommunication line, and passes the received data to the control unit 100. The communication I/F unit 120 also sends data passed from the control unit 100 to an other apparatus via the telecommunication line. The communication I/F unit 120 in this embodiment is used for data communication that is held to obtain an accompaniment sound signal of a karaoke tune from a karaoke tune distribution server.

The user I/F unit 130 includes a display unit and an operation unit. The display unit is made up of, for example, a liquid crystal display and a drive circuit for driving the liquid crystal display. The display unit displays various images under control of the control unit 100. Examples of images displayed on the display unit include an image of a menu screen that allows the user to select which karaoke tune the user wishes to sing, and an image of a scene fit to a karaoke tune of the user's choice (or an image in which character strings representing the lyrics of the karaoke tune are superimposed on the scene). The operation unit includes an input device, for example, a numeric keypad or a pointing device. When the user operates the input device, the operation unit passes operation data indicating the specifics of the operation by the user to the control unit 100. The control unit 100 is informed of the specifics of operation by the user in this manner.

The storage unit 140 includes a volatile storage unit 142 and a non-volatile storage unit 144 as illustrated in FIG. 2. The volatile storage unit 142 is, for example, a random access memory (RAM). The volatile storage unit 142 is used by the control unit 100 as a work area when the control program 1440 is executed. The non-volatile storage unit 144 is, for example, a hard disk drive or an electrically erasable programmable read-only memory (EEPROM). The control program 1440 is stored in the non-volatile storage unit 144 in advance.

Figure 7:
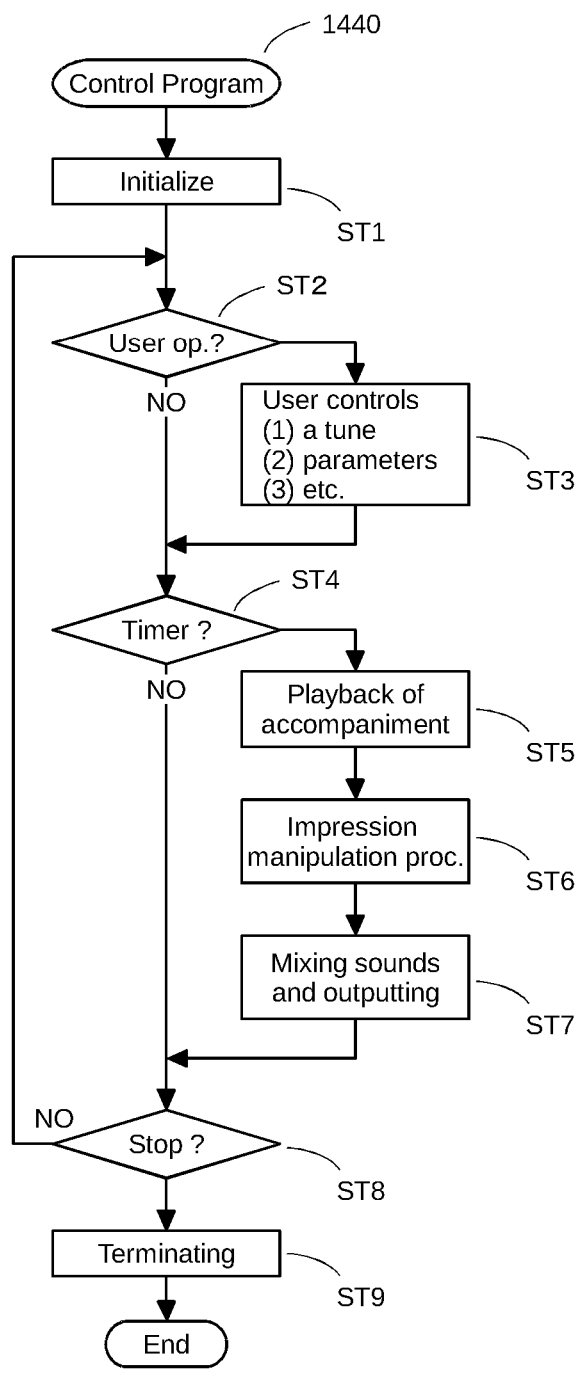
FIG. 7 is a flowchart for illustrating an example of the processing of the control unit 100 according to an embodiment of the present invention.

The control unit 100 reads the control program 1440 out of the non-volatile storage unit 144 onto the volatile storage unit 142, with the powering on or resetting of the sound signal processing apparatus 10 (a power source of the sound signal processing apparatus 10 is not shown) as a trigger, and starts executing the control program 1440 in FIG. 7. The control unit 100 operates as programmed in the control program 1440. The control unit 100 initially sets parameters and displays a karaoke screen on the display unit (ST1), executes processing of prompting the user to select a tune to be sung, and in response to tune-selecting operation by the user (ST2), obtaining (ST3) an accompaniment sound signal of the tune selected by the user. The control unit 100, in response to periodical timer interrupts (ST4), repeatedly executes processing of reproducing the obtained accompaniment sound signal (ST5), performing signal processing on a sound signal that represents the user's singing voice (i.e., a sound signal that is input from the sound signal input apparatus 11) to manipulate the impression of the singing voice (hereinafter referred to as "impression manipulation processing") (ST6), and mixing the sound signal processed by the signal processing with the accompaniment sound signal to output the mixed signal to the sound reproduction apparatus 12 (ST7). In the step ST5, the control unit 100 may be informed of parameter-setting operation by the user, and in that case, the control unit 100 sets one or more parameters as described later. The timer interrupt (ST4) is preemptive and the sound signals are not disturbed by the user control process (ST3). In response to stop command from the user (ST8), the control unit 100 terminates the control program (ST9). Those processes in FIG. 7 except some processes related to the impression manipulation processing (ST6) are not particularly different from processes executed in a general karaoke machine. The following description is therefore focused on the impression manipulation processing.

Figure 3:
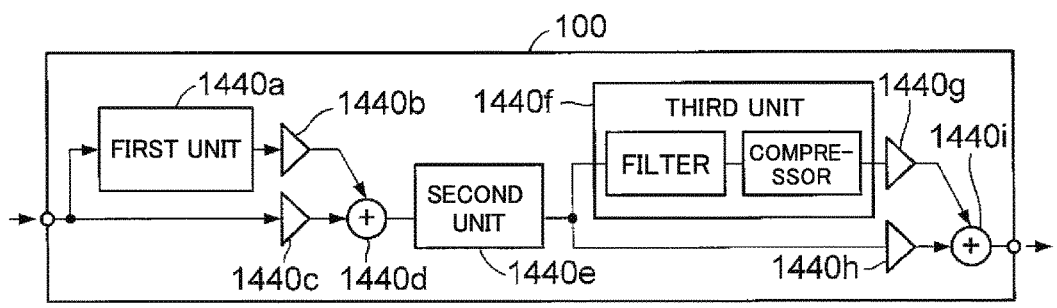
FIG. 3 is a function block diagram of signal processing executed by a control unit 100 of the sound signal processing apparatus 10 as programmed by a control program 1440.

Elements (function blocks) for the impression manipulation processing are roughly classified into signal processing blocks illustrated in FIG. 3 (a frequency band strengthening unit 1440a, amplifiers 1440b and 1440c, an adder 1440d, a level temporal change control unit 1440e, an overtone strengthening unit 1440f, amplifiers 1440g and 1440h, and an adder 1440i) and a control block, which controls the operation of the signal processing blocks. The units illustrated in FIG. 3 and the control block (not shown in FIG. 3) are software modules that are implemented by allowing the control unit 100 to operate as programmed by the control program 1440. The control block sets parameters of the signal processing blocks of FIG. 3, and controls the signal processing blocks so that processing procedures of the signal processing blocks are performed in an order illustrated in FIG. 3 on a sound signal input from the sound signal input apparatus 11. The signal processing blocks of FIG. 3 have the following roles:

The frequency band strengthening unit 1440a (a first unit) is, for example, a multiband compressor. The unit 1440a includes N (N is an integer equal to or more than 2) filters by which an input sound signal is divided into bands, and N compressors each connected in series to corresponding one of the filters (the compressors and filters of the unit 1440a are not shown in FIG. 3). The unit 1440a strengthens frequency components in a particular band of a sound signal input from the sound signal input apparatus 11 (hereinafter referred to as "original sound signal"), based on a set of parameters set by the control block. The set of parameters set for the unit 1440a by the control block are hereinafter referred to as "first parameters".

The first parameters include parameters of the N filters (for example, one or more cutoff frequencies of each band pass filter or a similar kind of parameter for each filter), and a threshold, a compression ratio, and one or more time constants for each of the N compressors and a output gain. The time constants may include one of or both of an attack time, which is defined as the length of time since the level of an input signal exceeds the threshold until compression (lowering the gain of the input signal) is started (or completed), and a release time, which is defined as the length of time since the level of an input signal drops lower than the threshold until stopping of the compression is started (or completed). In this embodiment, the values of the first parameters determine range of the particular band, as well as frequency components belonging to the particular band and the signal intensity of the frequency components is controlled according to the output gain in the first parameters.

As illustrated in FIG. 3, an original sound signal input to the control unit 100 is supplied to the adder 1440d after the strengthening of particular frequency components by the unit 1440a and amplification by the amplifier 1440b, and the same original sound signal is supplied to the adder 1440d after amplification by the amplifier 1440c. A gain of the amplifier 1440b and a gain of the amplifier 1440c are set by the control block as well. The adder 1440d mixes an output signal from the amplifier 1440b and an output signal from the amplifier 1440c to output the mixed signal to the level temporal change control unit 1440e.

The level temporal change control unit 1440e (a second unit) is a compressor. The unit 1440e controls temporal changes of the level of an input signal (in this embodiment, a sound signal to which signal components within a particular frequency band are already added) based on a set of parameters set by the control block. The set of parameters set for the unit 1440e by the control block are hereinafter referred to as "second parameters". The second parameters include a threshold, a compression ratio, and one or more time constants of the compressor. An output signal from the unit 1440e is supplied to the overtone strengthening unit 1440f as illustrated in FIG. 3.

The overtone strengthening unit 1440f strengthens harmonic components of an input sound signal (in this embodiment, an output signal from the level temporal change control unit 1440e) based on a set of parameters set by the control block. The set of parameters set for the unit 1440f by the control block are hereinafter referred to as "third parameters". As illustrated in FIG. 3, the overtone strengthening unit 1440f includes a filter and a compressor connected in series to the filter. The third parameters include a parameter of the filter and a threshold, a compression ratio, and one or more time constants of the compressor and a output gain.

As illustrated in FIG. 3, a sound signal input to the overtone strengthening unit 1440f is subjected to filtering process performed by the filter, and a signal output from the filter is subjected to level compression performed by the compressor. When the threshold is set to a rather low value or when the compression ratio is set to a rather high value, harmonic components in a rather wide band are strengthened, and this phenomenon is utilized by the overtone strengthen unit 1440f of this embodiment. The filter selectively filters the frequency band of the harmonic components. The filter resides upstream of the compressor in this embodiment, but the filter may reside downstream of the compressor. Alternatively, a filter for filtering the harmonic components may be provided both of upstream and downstream of the compressor.

The amplifier 1440g amplifies an output signal from the overtone strengthen unit 1440f, and supplies the amplified signal to the adder 1440i. The amplifier 1440h amplifies an output signal from the level temporal change control unit 1440e, and outputs the amplified signal to the adder 1440i. A gain of the amplifier 1440g and a gain of the amplifier 1440h are set by the control block as well. The adder 1440i outputs a signal that is obtained by mixing an output signal from the amplifier 1440g and an output signal from the amplifier 1440h. This mixing by the adder 1440 is necessary because the harmonic components contained in an output signal from the unit 1440f are often too heavily distorted to be directly output as sound. An output signal from the adder 1440i is mixed with the accompaniment sound signal, and the mixed signal is output via the external apparatus I/F unit 110 to the sound reproduction apparatus 12, which then emits the mixed signal as acoustic sound. Sound of the accompaniment sound of a karaoke tune and sound of the singing voice changed in impression by signal processing of the sound signal processing apparatus 10 are reproduced concurrently in this manner.

In this embodiment, the impression of a reproduced singing voice by the sound reproduction apparatus 12 may be controlled by adjusting the values of the first parameters, the second parameters, and the third parameters, and the gains of the amplifiers 1440b, 1440c, 1440g, and 1440h. For instance, the reproduced singing voice will become a glamorous sound by setting the first parameters so that frequency components around 9 kHz are strengthened. Similarly, the reproduced singing voice will become an overall breathy sound by setting the first parameters so that frequency components in 8 kHz or a higher band are strengthened, the overall breathy sound will possess a perceptible fluctuation of the breathiness by further setting a rather heavy compression for the input signal of high level period. The reproduced singing voice will become a radiant sound by setting the first parameters so that frequency components in 12 kHz or a higher band are strengthened. The degree of impression manipulation by the frequency band strengthening unit 1440a can be controlled by the adjustment of gains of the amplifiers 1440b and 1440c. For instance, when the first parameters are set so that frequency components around 9 kHz are strengthened, the reproduced singing voice will become more glamorous as the gain of the amplifier 1440b increases.

The reproduced singing voice by the sound reproduction apparatus 12 will become an edgy sound by setting the compression ratio in the second parameters to a rather high value. Similarly, the reproduced singing voice will become a well-modulated sound, a smooth sound, a sustaining sound, or the like by setting a rather large time constant in the second parameter and then adjusting the threshold and the compression ratio in the second parameters. The same applies to the third parameters, and the reproduced singing voice will become a powerful sound by setting the third parameters so that a target range is focused around 3 kHz (so that an overtone is effectively strengthened). The reproduced singing voice will become a robust sound by setting the third parameters so that the target range is focused around 5 kHz. The reproduced singing voice will become an enriched sound or a warm sound by setting the third parameters so that a frequency around 500 Hz to 3 kHz is strengthened.

An important point here is that, while each of the unit 1440a, the unit 1440e, and the unit 1440f has at least one compressor, parameters of the compressors are set separately and independently for each of the units. The reason is as follows. In the level temporal changes control, the parameters of the compressor are required to be set so that the effect is not too strong in order to prevent excessive modification on the temporal change of the level. The parameters of the compressor in the overtone strengthening, on the other hand, is required to be set so that the effect is substantially strong in order to ensure that the level of the harmonic components becomes high enough. The optimum parameters of the compressor thus vary according to the purpose of the unit to which it belongs, and the parameters for the overtone strengthening differs from the parameters for other than overtone strengthening, for example. Because it is not possible to achieve all purposes with one set of parameters of a compressor, this embodiment involves providing at least one independent compressor in each of the unit 1440a, the unit 1440e, and the unit 1440f, and setting parameters of the independent compressor separately and independently for each of the units.

The impression of a singing voice reproduced by the sound reproduction apparatus 12 can be controlled by adjusting the values of the first parameters, the second parameters, and the third parameters, and the gains of the amplifiers as described above. However, general karaoke users without special knowledge on signal processing could not determine which parameter is to be set to what value in order to yield a desired impression. This embodiment enables general users without special knowledge to easily perform impression manipulation by providing optimized values of the first parameters, the second parameters, and the third parameters and optimized gains of the amplifiers in relation with singing genres (for example, Japanese Enka ballad singing, rock singing, and ballad singing, in other words, the genre to which a tune to be sung belongs), under the editorial supervision of one or more persons with special knowledge (for example, an technician working at the manufacturer of the apparatus 10 or the program 1440; hereinafter referred to as "expert user"). At first, the optimized parameter values and the optimized gains are grouped in terms of the genres, and the grouped values and gains are stored in advance in the non-volatile storage unit 144 in association with genre identifiers, indicating the genres. Accordingly, the general user can set parameters optimum for the desired singing genre to the units illustrated in FIG. 3 by specifying a genre identifier that is associated with the desired genre.

To give a more detailed description, the non-volatile storage unit 144 stores, in association with a genre identifier of each genre, a set of parameter values optimized for one or more tunes that belong to the genre, and each stored set of parameters includes at least a user parameter for each unit associated with an impression identifier (for example, a character string representing an impression) that indicates some impression of a singing voice controlled by the parameter of the unit. The expert user determines in advance a suitable impression identifier of each unit for each singing genre independently, and therefore different impression identifiers may consequently be associated with the same parameter of the same unit according to the genres.

For instance, regarding to a "rock singing" genre, values of the first parameters for strengthening frequency components around 9 kHz, values of the second parameters including a rather high compression ratio, and values of the third parameters for strengthening a frequency around 3 kHz are stored in the storage unit 144, in this embodiment. In this case, "glamorousness" is stored as an impression identifier of a first user parameter in the first parameters, "edginess" is stored as an impression identifier of a second user parameter in the second parameters, and "powerfulness" is stored as an impression identifier of the third user parameter in the third parameters. Regarding to a "Japanese Enka ballad singing" genre, values of the first parameters for strengthening frequency components around or higher than 8 kHz with strong compression for the signal of high level period, values of the second parameters including an intermediate time constant, and values of the third parameters for strengthening a frequency around 5 kHz are stored in the storage unit 144. In this case, "pathos/longing" is stored as an impression identifier of the first user parameter, "modulation" is stored as an impression identifier of the second user parameter, and "robustness" is stored as an impression identifier of the third user parameter. Regarding to a "ballad singing" genre, values of the first parameters for strengthening frequency components around or higher than 12 kHz, values of the second parameters including a rather long time constant, and values of the third parameters for strengthening a frequency of from 500 Hz to 3 kHz are stored in the storage unit 144. In this case, "breathiness" is stored as an impression identifier of the first user parameter, "smoothness" is stored as an impression identifier of the second user parameter, and "warmth" is stored as an impression identifier of the third user parameter.

Figure 4:
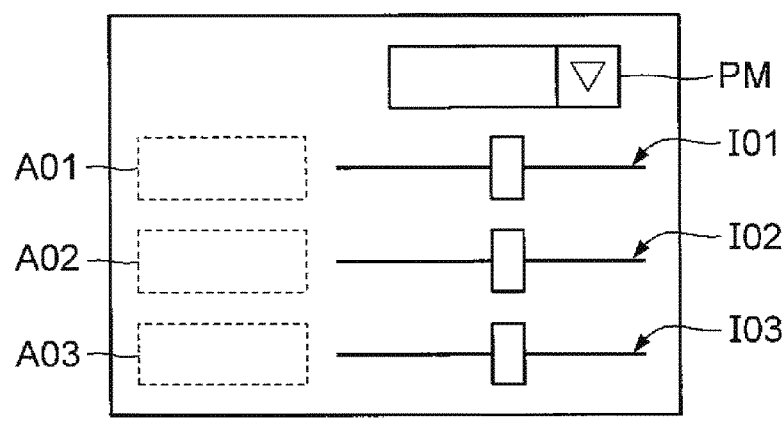
FIG. 4 is a diagram for illustrating an example of a setting screen, which is displayed on a display unit of a user interface (hereinafter abbreviated as "I/F") unit 13 by the control unit 100 as programmed by the control program 1440.

The control block (the control unit 100) of this embodiment displays a setting screen illustrated in FIG. 4 on the display unit of the user I/F unit 130 (ST3) in response to a setting start operation from the user (ST2), so that the user can set parameters suitable for the genre of a tune to be sung out of parameters grouped in the manner described above. The setting screen is provided with, as illustrated in FIG. 4, a pulldown menu PM, display areas A01 to A03, and display images I01 to I03. Genre identifiers associated with their respective groups are displayed in a list format in the pulldown menu PM. The user can select parameters fit to the genre of a tune to be sung by selecting one of the genre identifiers displayed in a list format. In response to the genre-selection operation by the user (ST2), the control block sets the parameters fit to the genre (ST3).

Figure 5A:
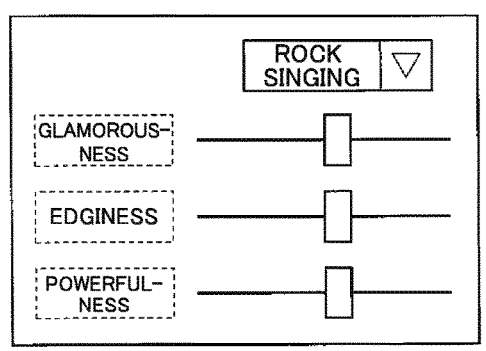
FIG. 5A and FIG. 5B are examples of updating the setting screen.

When the pulldown menu PM is operated by the user to select one of the genre identifiers (one of the genres), the control block reads parameter values and impression identifiers that are stored in the non-volatile storage unit 144 in association with the selected genre identifier (the selected genre), and sets the read parameters to the units illustrated in FIG. 3. The control block also displays the impression identifiers respectively in the display areas A01, A02, and A03 corresponding to the first to third parameters. When the pulldown menu PM is operated so that "rock singing" is selected, for example, the setting screen on the display unit is changed to display in the manner illustrated in FIG. 5A. When the pulldown menu PM is operated so that "Japanese Enka ballad singing" is selected, the setting screen is changed to display in the manner illustrated in FIG. 5B.

The display images I01 to I03 are virtual images of a slider or other controls. The control block moves the position of a knob on a virtual slider of the display image I01 in a manner based on the value of the first parameter read out of the non-volatile storage unit 144, moves the position of a knob on a virtual slider of the display image I02 in a manner based on the read value of the second parameter, and moves the position of a knob on a virtual slider of the display image I03 in a manner based on the read value of the third parameter. When the first parameter to the third parameter each include a plurality of parameters, one of the plurality of parameters is associated with the display image. For example, in the case of the second parameter, which includes three types of parameters, namely, threshold, compression ratio, and time constant, the threshold is associated with the display image I02.

When one of the display images I01 to I03 is operated by the user to change the displayed position of the knob on the virtual slider (ST2), the value of the parameter associated with the virtual slider may be changed in accordance with the operation (ST3). In the case of the second parameter, for example, the threshold is changed based on how the display image I02 is operated, while the compression ratio and the time constant are left not changed. The left end and right end of the movable area of the knob of the display image I02 in this case are associated with a minimum value and a maximum value in which the threshold can be set by the user (a minimum value and a maximum value relative to a reference value are determined by the tune genre or the like), and the knob of the virtual slider is displayed at a position of the threshold value associated with the reference value. This mode enables the user to make fine adjustments on the amount of control exerted on temporal changes of the level because a lower threshold means a stronger effect in signal processing of a compressor in general.

Figure 5B:
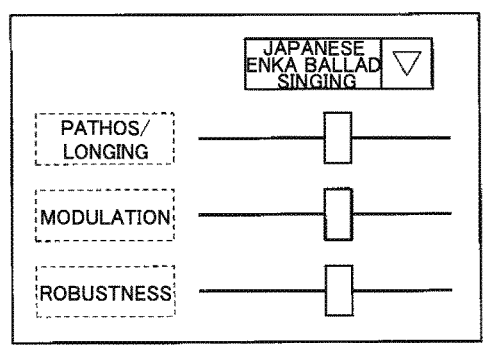

In this embodiment, the user can set parameters optimized by an expert user for a singing genre to the signal processing elements illustrated in FIG. 3 merely by specifying the singing genre, which allows the user to easily manipulate the impression of a singing voice. For instance, when a Japanese Enka ballad is sung with the first parameter to the third parameter set as illustrated in FIG. 5B, the singing voice is enhanced in pathos/longing, modulation, and robustness. According to the sound signal processing apparatus 10 of this embodiment, a user who possesses no special knowledge on signal processing of a sound signal can thus easily manipulate the impression of a voice represented by a sound signal. Another effect that is presented according to this embodiment is that, compared to the case in which a multiband compressor or a similar signal processing element is used alone, various manners of impression manipulation can be performed by a combination of frequency band strengthening, level temporal change control, and overtone strengthening, thereby rendering other additional elements such as a sound mixer and a DAW software unnecessary.

While the description given above is about an embodiment of the present invention, the embodiment may be modified as follows:

(1) The embodiment described above deals with a case in which the sound signal processing apparatus 10 is a karaoke machine, and the present invention is applied to a voice singing a tune. However, applications of the present invention are not limited to the singing voice, and may be applied to manipulation of impression of any of a guide voice, a speech, a narration, a recitation, and the like. Applications of the present invention are also not limited to a voice, and may be applied to the manipulation of the impression of an instrument sound of a tune. When the present invention is applied to the instrument sound, in the same way as the embodiment, the first parameters to the third parameters are grouped in accordance with the genre of the tune, or the genres of the instruments used, and are stored in advance in the storage unit, with impression identifiers indicating impressions controlled by the corresponding user parameters. For instance, a "violin" genre is associated with values of the first parameters for strengthening frequency components around or higher than 13 kHz, values of the second parameters including a rather short release time, and values of the third parameters for strengthening a frequency around 500 Hz to 3 kHz, and the first to third impression identifiers "radiance", "sustenance", and "warmth" are associated with the first user parameter, the second user parameter, and the third user parameter, respectively.

(2) While a user specifies a singing genre by operating the pulldown menu PM on the setting screen in the embodiment described above, a genre may be automatically set in connection with the selection of a tune to be sung. The setting screen is not necessary in this case. The parameters are not necessarily grouped for each singing genre but may be grouped for each tune genre, or for each singer genre or each tune player genre. The grouped parameters are not necessarily stored in the non-volatile storage unit 144 of the sound signal processing apparatus 10 in association with the genre identifiers but may be stored in a storage apparatus that can hold communication to/from the sound signal processing apparatus 10 via a communication line or via other measures (e.g., a hard disk apparatus that can be networked).

Figure 6A:
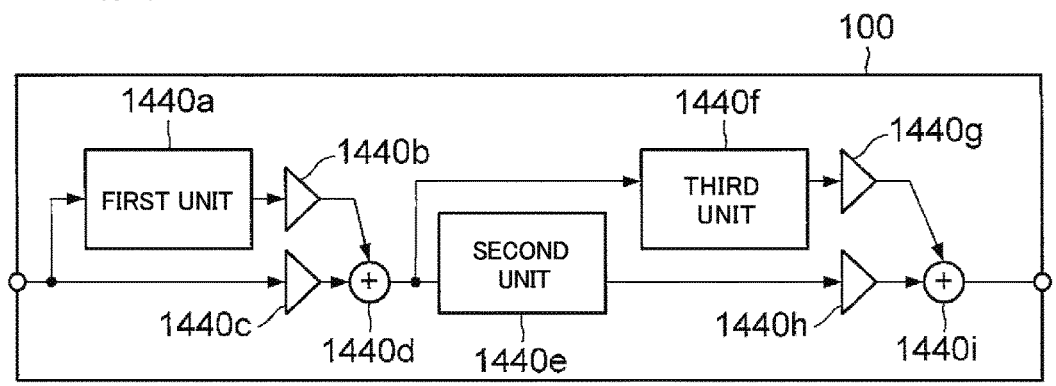
FIG. 6A and FIG. 6B are function block diagrams of signal processing in Modification Example (3).

(3) In the embodiment described above, the unit 1440e receives a mixed signal of a signal from the unit 1440a and an original sound signal, and a signal from the unit 1440e is further processed by the unit 1440f. One modification in FIG. 6A is that a first signal obtained by the level temporal change control unit 1440e processing the mixed signal from the adder 1440d and a second signal obtained by the overtone strengthening unit 1440f processing the same mixed signal are amplified and mixed to generate a sound signal to be supplied to the sound reproduction apparatus 12. Another modification in FIG. 6B is that a first signal obtained by the overtone strengthening unit 1440f processing the original signal, a second signal obtained by the frequency band strengthening unit 1440a processing the original signal, and the original signal are amplified and mixed, and the mixed signal is processed by the level temporal change control unit 1440e to generate a signal to be output to the sound reproduction apparatus 12.

Figure 6B:
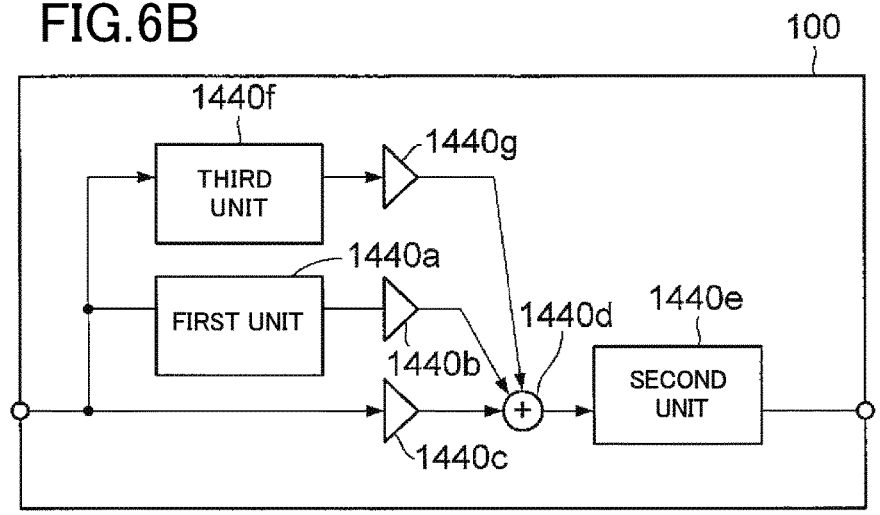

An advantage of the latter modification in FIG. 6B is that the level of the mixed sound signal of two processed signals by the frequency band strengthening unit 1440a and by the overtone strengthening unit 1440f is controlled by the level temporal change control unit 1440e. But no serious difference from it exists in the embodiment in FIG. 3 or the former modification in FIG. 6A, if the gain of the amplifier 1440h for the level temporal change control unit 1440e is sufficiently larger than the gain of the amplifier 1440g in the subsequent processing.

The control unit 100 may execute signal processing that is specified by the user out of the three types of signal processing of the embodiment in FIG. 3, the modification in FIG. 6A, and the modification in FIG. 6B. The control unit 100 may automatically switch from one of the three types of signal processing to another to process a sound signal, depending on the singing genre of a singing voice represented by the sound signal to be processed.

(4) In the embodiment described above, the control unit 100 executes control program 1440 to function as the units illustrated in FIG. 3 and as the control block. Any of the units in FIG. 3 and the control block may be implemented by pieces of hardware such as an electronic circuit, to configure the sound signal processing apparatus 10 as the combination of the pieces of hardware and the control unit 100. The same may apply to the modification in FIG. 6A or FIG. 6B. The amplifiers 1440b, 1440c, 1440g, and 1440h in FIG. 3 are not indispensable, and any of them may be omitted. The same applies to the amplifiers in FIG. 6A or FIG. 6B. When the amplifier 1440c in FIG. 3 is omitted, the adder 1440d may be omitted, so that an output signal from the unit 1440a is input to the unit 1440e via the amplifier 1440b (or input directly to the unit 1440e by omitting the amplifier 1440b as well).

(5) In the embodiment described above, the sound signal input apparatus 11, which supplies an input sound signal to be processed to the apparatus 10, and the sound reproduction apparatus 12, which reproduces an output signal from the apparatus 10, are connected to the sound signal processing apparatus 10 via audio cables or the like by one to one topology. One or both of the apparatus 11 and the apparatus 12 may be connected to the sound signal processing apparatus 10 via a communication network such as the Internet. For example, when the apparatus 11 and the apparatus 12 are both connected to the apparatus 10 via a network, the signal processing apparatus 10 may provide a sound impression manipulation service of an application service provider (ASP) type.

While all described here are some embodiments of the invention, various modifications may be made thereto, and it is intended that the appended claims cover all such modifications as fall within the true spirit and scope of the invention.

What is claimed is:

1. A method of processing an input sound signal of singing voice, to obtain a processed sound signal with an impression different from the input sound signal using a processor or circuit that provides at least a first sound effect, the method comprising the steps of:
selecting a genre from among a plurality of tune genres for singing voice in accordance with a selection operation by a user;
reading out from a memory a set of parameters, including a set of first parameters and a first impression identifier, corresponding to the selected genre, the first impression identifier representing an impression controlled by a first user parameter included in the set of first parameters;
setting, to the first sound effect, the set of first parameters corresponding to the selected genre;
displaying the first impression identifier corresponding to the selected genre and a first control that permits changing of the first user parameter by the user;
changing the first user parameter in accordance with a first change operation on the first control by the user; and
adjusting, using the first sound effect, signal components within a particular frequency band of the input sound signal, in accordance with the set of first parameters including the first user parameter, to obtain the processed sound signal.

2. The method according to claim 1, wherein the first impression identifier is a character string.

3. The method according to claim 1, wherein the first impression identifier differs according to the corresponding genre.

4. The method according to claim 1, wherein the set of first parameters determine the particular frequency band within which the signal components are adjusted by the first sound effect.

5. The method according to the claim 1, wherein:
the processor or circuit provides a second sound effect,
the read-out set of parameters further include a set of second parameters and a second impression identifier, corresponding to the selected genre, the second impression identifier representing an impression controlled by a second user parameter included in the set of second parameters, and
the method further comprises:
setting, to the second sound effect, the set of second parameters corresponding to the selected genre;
displaying the second impression identifier corresponding to the selected genre and a second control that permits changing of the second user parameter by the user;
changing the second user parameter in accordance with a second change operation on the second control by the user; and
controlling, using the second sound effect, a temporal change of level of the sound signal processed by the first sound effect, in accordance with the set of second parameters including the second user parameter.

6. The method according to the claim 5, wherein:
the processor or circuit provides a third sound effect,
the read-out set of parameters further include a set of third parameters and a third impression identifier, corresponding to the selected genre, the third impression identifier representing an impression controlled by a third user parameter included in the set of third parameters, and
the method further comprises:
   setting, to the third sound effect, the set of third parameters corresponding to the selected genre;
   displaying the third impression identifier corresponding to the selected genre and a third control that permits changing of the third user parameter by the user;
   changing the third user parameter in accordance with a change operation on the third control by the user; and
   adjusting, using the third sound effect, harmonic components of the sound signal processed by the second sound effect, in accordance with the set of third parameters including the third user parameter.

7. The method according to the claim 1, wherein the first sound effect includes a multi-band compressor.

8. The method according to the claim 5, wherein the second sound effect includes a compressor.

9. The method according to the claim 6, wherein the third sound effect includes a filter and a compressor connected in series.

10. The method according to the claim 6, wherein adjustments using the first, second, and third sound effects are executed in a predetermined order.

11. A non-transitory computer-readable storage medium storing a program executable by a computer to execute a method of processing an input sound signal of singing voice, to obtain a processed sound signal with an impression different from the input sound signal, using at least a first sound effect provided by the computer, the method comprising the steps of:
   selecting a genre from among a plurality of tune genres for singing voice in accordance with a selection operation by a user;
   reading out from a memory a set of parameters, including a set of first parameters and a first impression identifier, corresponding to the selected genre, the first impression identifier representing an impression controlled by a first user parameter included in the set of first parameters;
   setting, to the first sound effect, the set of first parameters corresponding to the selected genre;
   displaying the first impression identifier corresponding to the selected genre and a first control that permits the user to change the first user parameter;
   changing the first user parameter in accordance with a first change operation on the first control by the user; and
   adjusting, using the first sound effect, signal components within a particular frequency band of the input sound signal, in accordance with the set of first parameters including the first user parameter, to obtain the processed sound signal.

12. A sound signal processing apparatus for processing an input sound signal of singing voice, to obtain a processed sound signal with an impression different from the input sound signal, the apparatus comprising:
   a processor that implements stored instructions or a circuit that provides at least a first sound effect and executes a plurality of tasks, including:
     a receiving task that receives a selection of a genre from among a plurality of tune genres for singing voice in accordance with a selection operation by a user;
     a reading task that reads out from a memory a set of parameters, including a set of first parameters and a first impression identifier, corresponding to the selected genre, the first impression identifier representing an impression controlled by a first user parameter included in the set of first parameters;
     a setting task that sets, to the first sound effect, the set of first parameters corresponding to the selected genre;
     a displaying task that displays the first impression identifier corresponding to the selected genre and a first control that permits the user to change the first user parameter;
     a changing task that changes the first user parameter in accordance with a first change operation on the first control by the user; and
     an adjusting task that adjusts, using the first sound effect, signal components within a particular frequency band of the input sound signal, in accordance with the set of first parameters including the first user parameter, to obtain the processed sound signal.

* * * * *